(12) United States Patent
Schell

(10) Patent No.: US 7,221,724 B2
(45) Date of Patent: May 22, 2007

(54) PRECISION TIMING GENERATION

(75) Inventor: Stephan Schell, San Mateo, CA (US)

(73) Assignee: Bitzmo, Inc., Campbell, CA (US)

( * ) Notice: Subject to any disclaimer, the term of this patent is extended or adjusted under 35 U.S.C. 154(b) by 787 days.

(21) Appl. No.: 10/268,022

(22) Filed: Oct. 10, 2002

(65) Prior Publication Data

US 2004/0071249 A1 Apr. 15, 2004

(51) Int. Cl.
*H04L 7/00* (2006.01)

(52) U.S. Cl. .................. 375/355; 375/354; 341/131; 342/357.12; 342/450; 327/231; 327/270; 327/105; 708/313; 348/592; 368/113

(58) Field of Classification Search .............. 375/354; 341/131; 342/357.12, 450; 327/231, 270, 327/105; 708/313; 348/592; 368/113
See application file for complete search history.

(56) References Cited

U.S. PATENT DOCUMENTS

| 4,389,664 | A | * | 6/1983 | Robitzsch | 348/592 |
| 5,541,864 | A | * | 7/1996 | Van Bavel et al. | 708/313 |
| 5,793,709 | A | * | 8/1998 | Carley | 368/113 |
| 6,016,113 | A | * | 1/2000 | Binder | 341/131 |
| 6,094,082 | A | * | 7/2000 | Gaudet | 327/270 |
| 6,121,808 | A | * | 9/2000 | Gaudet | 327/231 |
| 6,300,903 | B1 | * | 10/2001 | Richards et al. | 342/450 |
| 6,396,313 | B1 | * | 5/2002 | Sheen | 327/105 |
| 6,430,208 | B1 |   | 8/2002 | Fullerton et al. | 375/130 |
| 6,590,528 | B1 | * | 7/2003 | DeWulf | 342/357.12 |
| 2003/0108136 | A1 | * | 6/2003 | Wang et al. | 375/354 |

OTHER PUBLICATIONS

Christiansen ("An integrated CMOS 0.15 ns digital timing generator for TDC's and clock distribution systems"; IEEE Transactions on Nuclear Science; vol. 42, Issue 4, Part 1-2; Aug. 1995; pp. 753-757).*
Rodrigues ("Applying Affine Transformation to Images"; Oct. 2001; pp. 1-5; http://www.awprofessional.com/articles/article.asp?p=23667&rl=1 ).*

(Continued)

*Primary Examiner*—Jay K. Patel
*Assistant Examiner*—Sudhanshu C. Pathak
(74) *Attorney, Agent, or Firm*—Edward C. Kwok; MacPherson Kwok Chen & Heid LLP

(57) ABSTRACT

A precision timing generator and an associate method provide a precise clock signal based on a reference clock signal. Using the reference clock signal in a phase locked loop or delay locked loop, a number of clock signals of equal frequency are generated separated consecutively by a known phase. Two of these clock signals of consecutive phases are selected for interpolation for higher precision according to predetermined weights. The resulting interpolated clock signal has a phase offset that is intermediate between the selected clock signals in proportion to the predetermined weights. In one implementation, a second interpolated clock signal is created by selecting and weighting a second group of clock signals using independent selection and weights. The two interpolated clock signals are then combined by logic operations to provide a precise clock signal of predetermined duty cycle and phase.

14 Claims, 6 Drawing Sheets

OTHER PUBLICATIONS

Bazes ("An Intepolating Clock Syntheizer"; IEEE Journal of Solid-State Circuits; vol. 31, No. 9; Sep. 1996; pp. 1295-1301.*
Hodges et al. ("Design of PLL-Based Clock Generation Circuits"; IEEE Journal of Solid-State Circuits; vol. Sc-22, No. 2; Sep. 1987; pp. 255-261.*

Win, M., et al., "Ultra-Wide Bandwidth Time-Hopping Spread-Spectrum Impulse Radio for Wireless Multiple-Access Communications," *IEEE Transactions on Communications*, vol. 48, No. 4, Apr. 2000, pp. 679-691.

* cited by examiner

PRECISION TIMING GENERATION

BACKGROUND OF THE INVENTION

1. Field of the Invention

The present invention relates to a precise timing generator in an integrated circuit. In particular, the present invention relates to a precise timing generator in an integrated circuit suitable for use with pulse position modulation (PPM) applications.

2. Discussion of the Related Art

Ultra wide bandwidth (UWB) communication is an emerging technology for high data rate wireless communication. In some proposed UWB systems, the signal comprises pulses of defined duration (e.g., Gaussian pulses) that can be transmitted with or without modulation of a conventional carrier. In addition, the UWB communication can occur over a wide frequency band, which may or may not be sub-divided into channels. These proposed UWB systems are disclosed, for example, in (a) U.S. Pat. No. 6,430,208, to Fullerton et al., Ser. No. 09/037,704, filed on Mar. 10, 1998, and (b) "Utra-Wide Bandwidth Time-Hopping Spread-Spectrum Impulse Radio for Wireless Multiple-Access Communications," by M. Win et al., published in *IEEE Transaction on Communication*, Vol. 48, No. 4, April 2000, pp. 679–691.

In some of these proposed UWB systems, the pulses can be time-coded ("time-hopping"), pulse position or polarity modulated. Most of these proposed schemes require a precise timing generator to provide the precisely timed signals for transmission or reception. In the prior art, such as the system described in the U.S. Pat. No. 6,430,208 mentioned above, the timing generator circuit provided is large, occupying an integrated circuit separate from the signal processing integrated circuit, and dissipating a substantial amount of power (e.g., 500 mW). Thus, there is a need to provide a precise timing generator that is suitable for use in such application as UWB communications on the same integrated circuit as the signal processing circuit and which draws substantially less power than the precision timing generator of the prior art.

SUMMARY OF THE INVENTION

According to the present invention, a precision timing generator and an associate method provide a precise clock signal based on a reference clock signal. This precise clock signal can be used in any application in which a highly precise clock signal is required, such as for generating ultra-wide bandwidth (UWB) pulses using pulse-position modulation or time-hopping protocols. Since the precision clock signal under the present invention can be generated using analog CMOS circuit techniques, for signal processing applications, the precise clock signal can be generated on the same integrated circuit as the signal processing circuits and draws power that is substantially less than that drawn in the prior art for UWB applications.

According to one embodiment of the present invention, using the reference clock signal in a phase locked loop or delay locked loop, a number of clock signals of equal frequency are generated, each clock signal being separated from a consecutively following clock signal by a known phase. From these clock signals, two successive clock signals are selected for interpolation for higher precision according to a set of predetermined weights. The resulting interpolated clock signal has a phase offset that is intermediate between the selected clock signals, but in proportion to the predetermined weights. The weights can be expressed, for example, as binary fractions that sum to a binary '1'.

According to one embodiment of the present invention, the interpolator includes low pass filters that filter the selected clock signals, which are then amplified in variable gain amplifiers to provide signals that rise in proportion to their associated weights. These signals are then summed to provide a resulting clock signal. Such a clock signal has a precisely determined clock phase, and can be provided at approximately 50% duty cycle, such that it can also be used as a trigger signal for a triggered pulse generator.

In one implementation, a second interpolated clock signal is created by independently selecting and weighting a second group of clock signals. The two interpolated clock signals are then combined by a logic operation to provide a precise clock signal of a predetermined duty cycle and phase. As mentioned above, such a clock signal can be used as a trigger signal for a triggered pulse generator. Alternatively, such a clock signal can also be provided as an input signal to a pulse-shaping network, such as a passive filter. The pulse-shaping network may include passive elements (e.g., resistors, capacitors, inductors and diodes), an antenna, or any active element appropriate for the implementation.

The present invention is better understood upon consideration of the detailed description below and the accompanying drawings.

BRIEF DESCRIPTION OF THE DRAWINGS

To facilitate comparison across the figures above, like elements in the above figures are provided like reference numerals.

DETAILED DESCRIPTION OF THE PREFERRED EMBODIMENTS

Figure 1:
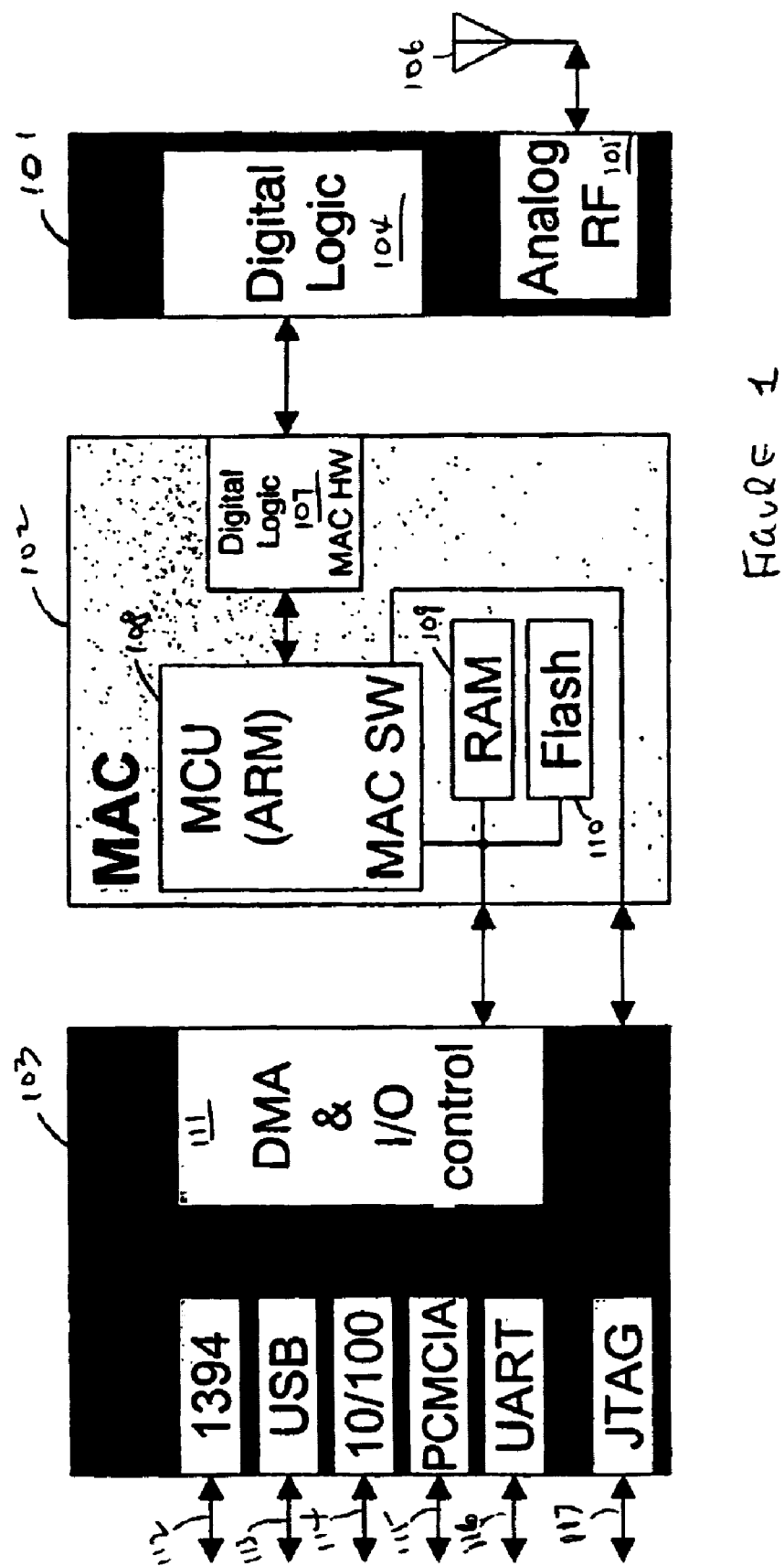
FIG. 1 is a functional block diagram of exemplary integrated circuit 100 for use in UWB wireless communications, according to one embodiment of the present invention.

The present invention can be implemented in an integrated circuit for communication over an ultra-wide bandwidth (UWB) wireless personal area network (WPAN). FIG. 1 is a functional block diagram of exemplary integrated circuit 100 for such an application, according to one embodiment of the present invention.

As shown in FIG. 1, integrated circuit 100 includes physical layer (PHY) circuit 101, media access control (MAC) circuit 102, and memory control and input/output (I/O) interface circuit 103. PHY circuit 101 includes a digital logic circuit 104, which interfaces with MAC circuit 102 and manages analog radio frequency (RF) interface circuit 105. Analog RF interface circuit 105 includes an analog RF transmitter and an RF receiver for transmitting and receiving signals to and from one or more antennae operating in a wireless communication channel.

MAC circuit 102 includes digital logic interface 107, which interfaces with PHY circuit 101, and a microcontroller-based control system. The microcontroller-based control system includes microcontroller 108, which can be implemented by an embedded microprocessor (e.g., ARM), a run-time random access memory (RAM) 109 and non-volatile memory 110 (e.g., a flash memory). Software for microcontroller 108 can be stored, for instance, in non-volatile memory 110, and loaded into RAM 109 at run time.

Memory and I/O control circuit 103, which operates under the control of microcontroller 108, controls accesses to RAM 109, non-volatile memory 110, and external peripheral modules, or a host computer. FIG. 1 provides some examples of interfaces to peripheral modules that can be provided, such as a 1394 high-speed serial interface 112, a universal serial bus interface 113, Ethernet interface 114, PCMCIA interface 115, universal asynchronous receiver/transmitter (UART) interface 115, and JTAG (test access port and boundary-scan) interface 117.

Figure 2:
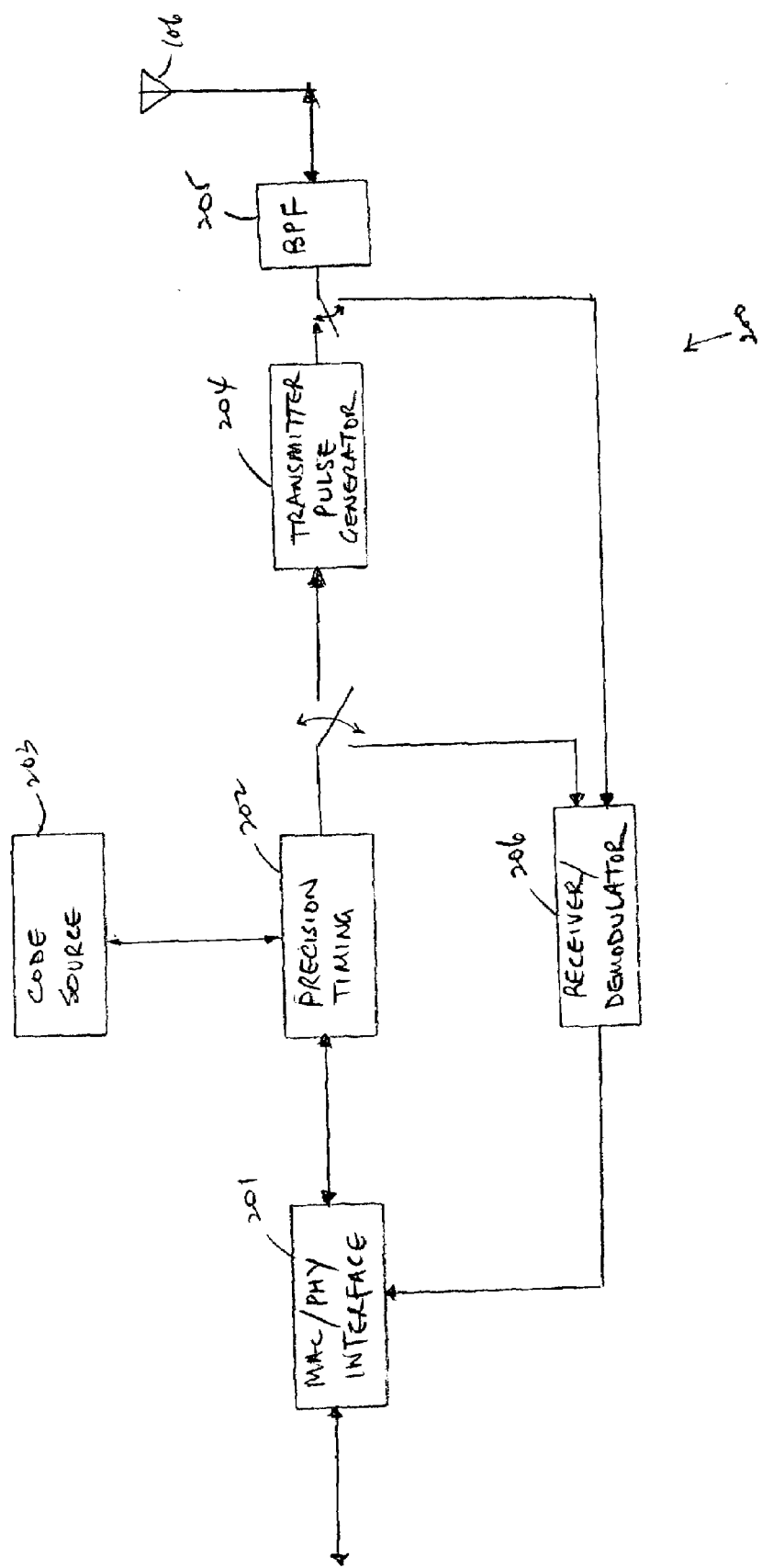
FIG. 2 is a block diagram 200, showing in further details PHY circuit 101 of FIG. 1.

FIG. 2 is a block diagram 200, showing in further details PHY circuit 101 of FIG. 1. As shown in FIG. 2, PHY circuit 101 includes interface circuit 201, which communicates control signals and data between PHY circuit 101 and microcontroller 108 of MAC circuit 102 over digital logic interface 107 (FIG. 1). Data from MAC circuit 102 includes fine timing information to be provided to precision timing generator 202, which also receives coarse timing information from code source 203. The fine and coarse timing information received at precision timing generator 202 is used to provide, as discussed below, a highly accurate and reliable timing signal for use with UWB signaling. The highly accurate timing signal is provided to both transmitter pulse generator 204, to generate pulses for transmission over the wireless channel, and to be used in the demodulation and the decoding of received signals in receiver/demodulator 206. Pulses output from transmitter pulse generator 204 are band-limited in band pass filter 205 for transmission into the wireless channel. Similarly, signals received from antenna 106 are band-limited by band pass filter 205 for receiver/demodulator 204. (Band pass filter 205 is an optional element provided for shaping the power spectrum of the output signal to be transmitted over antenna 106; antenna 106 can also provide such shaping in whole or in part).

Figure 3:
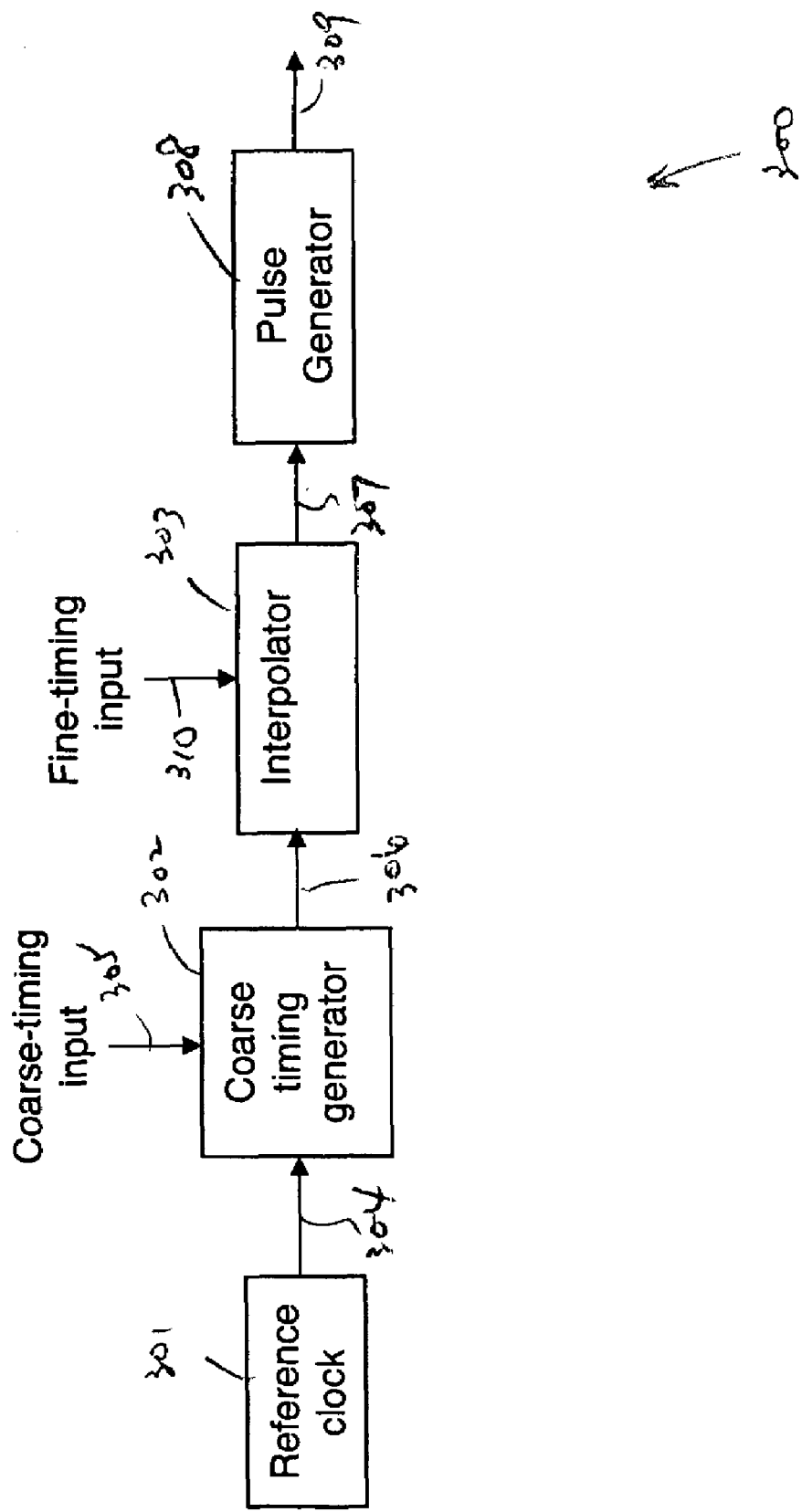
FIG. 3 shows one implementation of precision timing generator 202 of FIG. 2 in block diagram form as timing generation circuit 300.

One implementation of precision timing generator 202 of FIG. 2 is shown in block diagram form in FIG. 3 as timing generation circuit 300. As shown in FIG. 3, reference clock signal circuit 301 provides reference clock signal 304 to coarse timing generator 302. Reference clock signal 304 can be provided, for example, from a conventional crystal oscillator (not shown). In addition to reference clock signal 304, coarse timing generator 302 also receives input signals 305 that convey coarse timing information from code source 203 of FIG. 2. From these signals, coarse timing generator 302 generates timing events (e.g., transitions of a clock signal) 306 that are spaced in predetermined intervals. Coarse timing generator 302 can be implemented, for example, by a circuit including a delay locked loop or a phase locked loop. Interpolator 303, which receives fine-timing information 310 from MAC circuit 102, as mentioned above, then interpolates between timing events 306 to obtain highly precise timing signals 307 at time points between any two of coarse timing events 306. Timing signals 307 are then used to generate precise timing pulses 309 in pulse generator 308.

Figure 4:
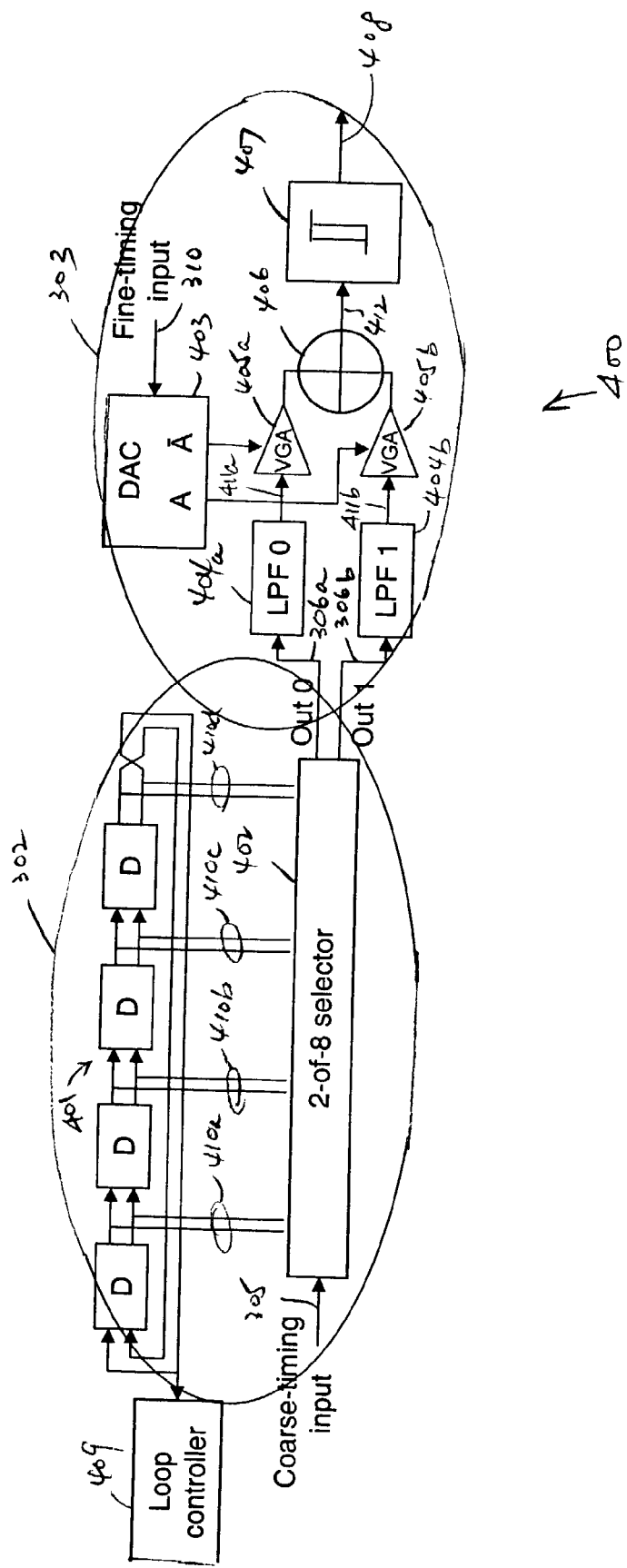
FIG. 4 is a block diagram 400, showing further additional details of precise timing generator 202.

FIG. 4 is a block diagram 400, showing further additional details of precise timing generator 202, according to one embodiment of the invention. As shown in FIG. 4, delayed lock loop 401 (locked to a reference clock signal by loop controller 409) generates a number of low frequency clock signal pairs 410a–410d. Each of clock signal pairs 401a–410d (e.g., clock signal pair 410a) includes two clock signals that are 180° out of phase. Further, a predetermined phase separate adjacent clock signal pairs (e.g., clock signal pairs 410a and 410b). For illustration purpose, FIG. 4 shows only four stages in delay locked loop 401, outputting a total of eight clock signals. However, the number of output clock signals is not so limited. In general, an N-stage delay locked loop, such as delay locked loop 401, provides 2N clock signals of the same frequency that are equally spaced in phase. In FIG. 4, 2-of-8 selector circuit 402 selects two clock signals of consecutive phases from clock signal pairs 410a to 410d for output at terminals 306a and 306b to interpolator 303. (In general, a selector has 2N ways to select two consecutive phase clock signals out of 2N clock signals that are equally spaced in phase). A low power implementation of delay locked loop 401, with carefully controlled propagation delays in the logic elements and the interconnect paths, can be achieved on an integrated circuit using simple geometrical scaling rules in CMOS technology.

As shown in FIG. 4, interpolator 303 includes digital-to-analog converter (DAC) 403, low pass filters 404a and 404b, variable gain amplifiers (VGA) 405a and 405b, summer 406, and high gain amplifier 407. The operations of interpolator 303 are described in conjunction with the waveforms segments 501–508 shown in FIG. 5.

Figure 5:
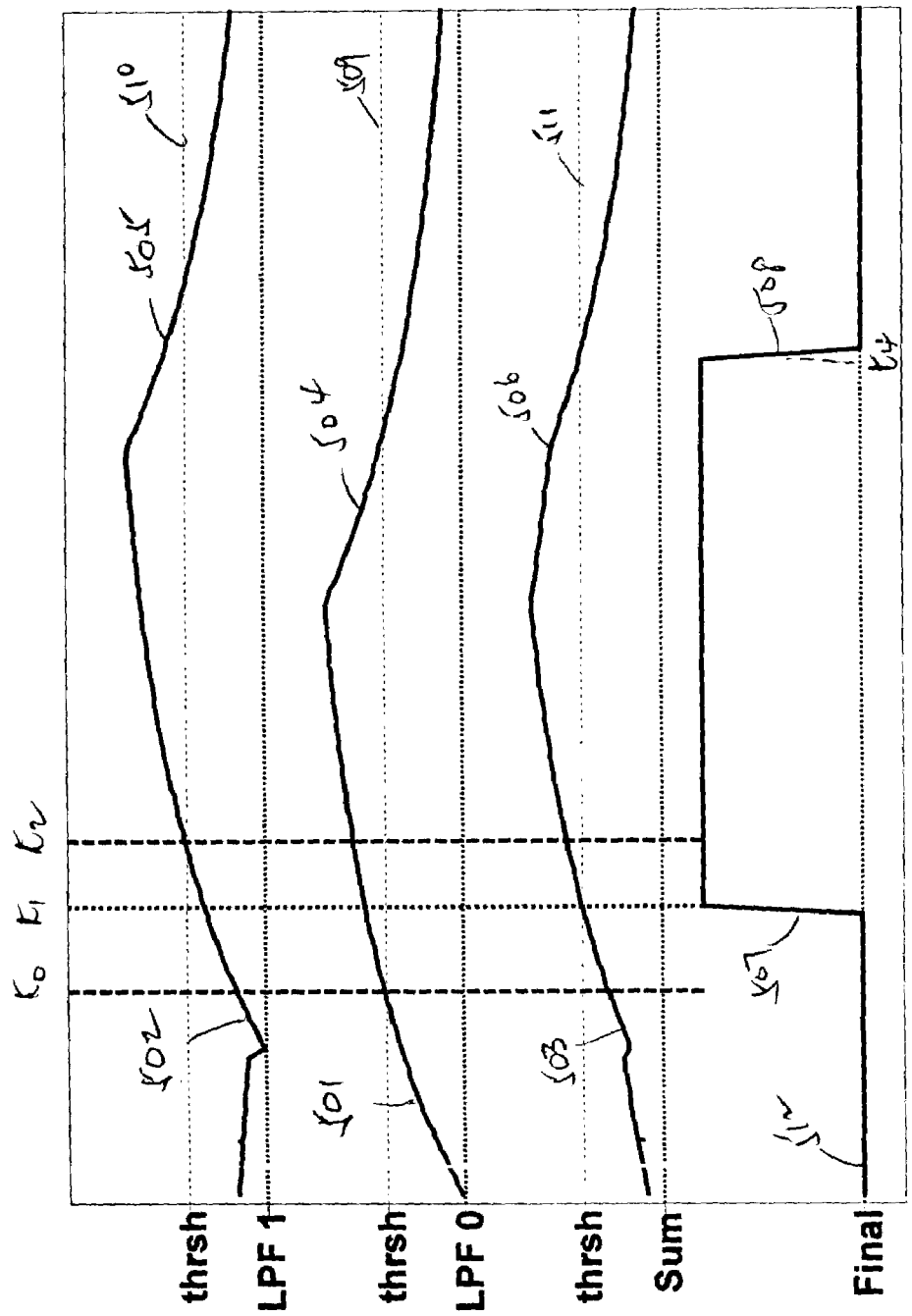
FIG. 5 shows waveforms segments 501–508, which illustrate the operations of interpolator 303.

Low pass filters 404a and 404b each receive one of the two selected clock signals output from selector 402 at terminals 306a and 306b, and integrate the corresponding voltage step at each rising or falling edge of each clock signal. The integrated voltage waveforms at terminals 411a and 411b, which correspond to integrating the voltage steps of the rising edges of clock signals 306a and 306b, respectively, are shown in FIG. 5 as waveform segments 501 and 502. Similarly, the integrated voltage waveforms at terminals 411a and 411b, which correspond to integrating the voltage steps of the falling edges of clock signals 306a and 306b, respectively, are shown in FIG. 5 as waveform segments 504 and 505. The integrated waveforms at terminals 411a and 411b are amplified by VGA 405a and 405b. DAC 403 sets the gains in VGA 405a and 405b according to fine timing input information (indicated in FIG. 4 by numeral 310). In this embodiment, the gains in VGA 405a and 405b are proportional to the respective weights assigned to the phases of the clock signals at terminals 306a and 306b. In one implementation, the weights are provided as two binary fractions that sum to a binary 1 (i.e., the binary fractions are bit-wise complementary to each other). The output voltages of VGA 405a and 405b are summed in summer 406.

Referring to FIG. 5, the summed voltage waveform for the rising edge transitions of the clock signals at terminals 306a and 306b is shown in FIG. 5 as waveform segment 503. Similarly, the summed voltage waveform for the falling edge transitions of the clock signals at terminals 306a and 306b is shown in FIG. 5 as waveform segment 506. As seen in FIG. 5, the integrated waveform segment 501, corresponding to a rising edge transition of the clock signal at terminal 306a, reaches a threshold voltage (indicated by numeral 509) at time $t_0$. The integrated waveform segment 502, corresponding to the rising edge transition of the clock signal at terminal 306b—which occurs at a fixed time (i.e., phase) after the rising edge transition of the clock signal at terminal 306a—reaches the threshold voltage (indicated by numeral 510) at time $t_2$ The summed voltage segment 503 reaches the threshold voltage (indicated by numeral 511) at time $t_1$, which location in time between times to and $t_2$ is approximately linearly related to the relative gains of VGA 405a and 405b set by DAC 403 according to the fine timing input information 310. By comparing threshold value 511 with the summed voltage at terminal 412 (i.e., voltage segments 503 and 506) in a high gain amplifier, an output waveform (shown as waveform 512 in FIG. 5) is obtained which shows that rising edge 507 is precisely obtained at time $t_1$. Similarly, the falling edge 508 can be precisely obtained at time $t_4$, according to the weighted sum of integrated waveform segments 504 and 505. Thus, the resulting clock signal in output waveform 512 has a high logic value between times $t_1$ and $t_4$. Such a clock signal has a precisely determined clock phase, and can be provided at approximately 50% duty cycle, such that it can also be used as a trigger signal for a triggered pulse generator. Alternatively, such a clock signal can also be provided as an input signal to a pulse-shaping network, such as a passive filter. The pulse-shaping network may include passive elements (e.g., resistors, capacitors, inductors and diodes), an antenna, or any active element appropriate for the implementation.

For use in a UWB communication application using pulse position modulation, design considerations relevant to the present invention include a trade-off between the resolution of coarse timing generator 302 and interpolator 303. For example, if each delay element of delay locked loop 401 is nominally 500 picoseconds (ps), then the nominally frequency of delay locked loop 401 would be 250 MHz, with neighboring clock signals being offset in phase by 500 ps. (Hence, the coarse timing resolution in coarse timing generator 302 is nominally 500 ps). If DAC 403 receives a 3-bit input, eight uniformly spaced output levels can be provided to control variable gain amplifiers 405a and 405b, thus providing eight fine-timing steps (62.5 ps each) within each 500 ps window. In a UWB application, coarse timing input can be modulated according to a code to achieve, for example, spectral spreading and multiple access control, while the fine timing input may be modulated according to a desired message stream (e.g., the information bits or payload to be transmitted). Thus, the resolution partitioning between the coarse and fine timing circuits may take into consideration both integrated circuit design trade-offs (e.g., current and area requirements) and communication design trade-offs (e.g., data rate, robustness to multipath propagation, accommodation of multiple access requirements, and noise immunity).

Figure 6:
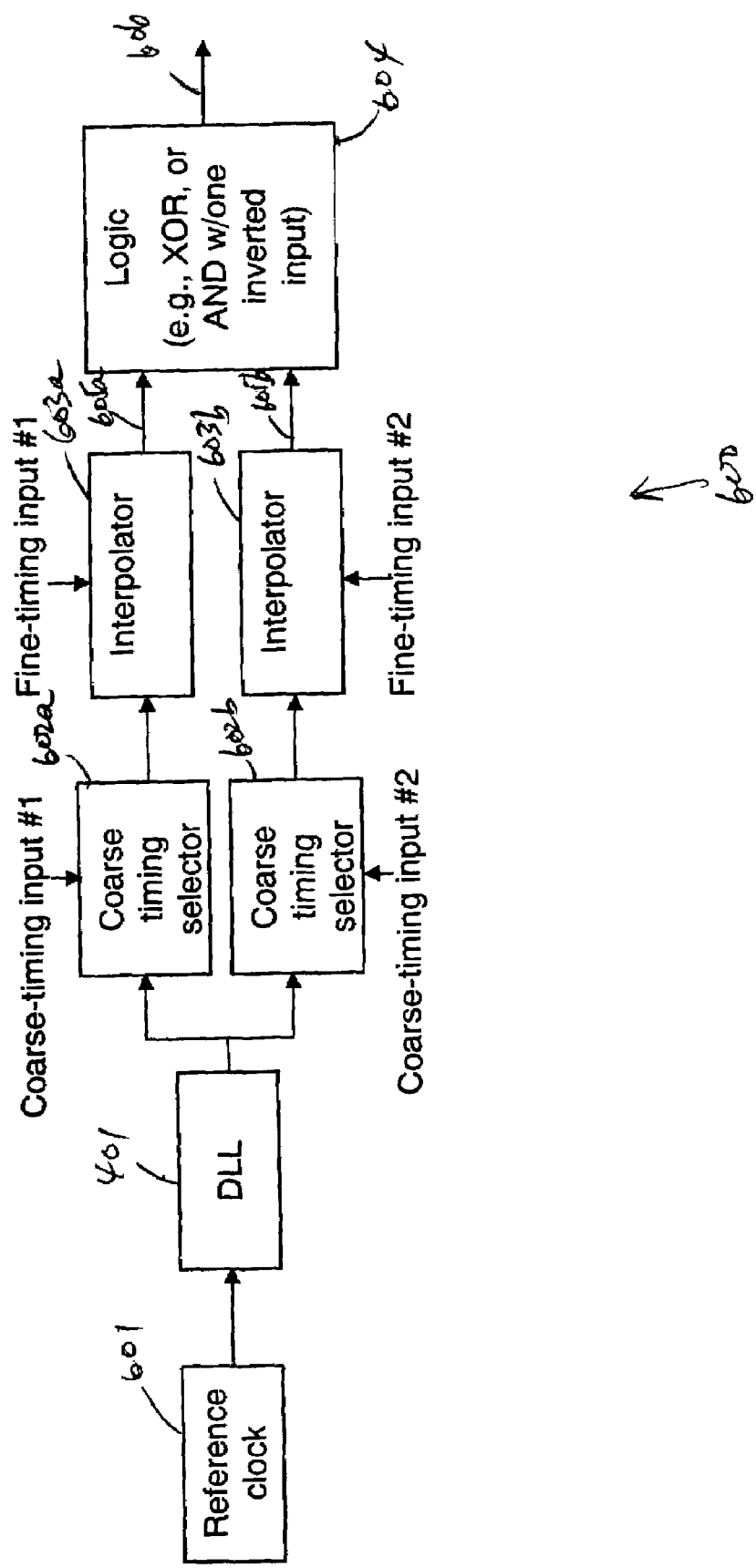
FIG. 6 shows circuit 600, which provides two independently generated clock signals using two sets of clock signal selectors and interpolators from the same delay locked loop; the independently generated clock signals are logically combined to form a clock signal with a desired duty cycle or pulse width.

If it is desired to adjust the duty cycle of the resulting output waveform, two highly precise clock signals based on the same phase locked loop or delay locked loop can be obtained using two sets of clock signal selectors and interpolators. Such a circuit is illustrated by circuit 600 shown of FIG. 6. In FIG. 6, delay locked loop 401 is locked into a reference clock signal provided by reference clock generator 601. Coarse timing selector 602a and interpolator 603a form one precision timing generator to generate a first clock signal at terminal 605a. This first clock signal can be generated, for example, in the manner described above in conjunction with FIGS. 4 and 5 for precise timing generator 202. Similarly, using independent coarse timing and fine timing information, a second clock signal is generated at terminal 605b using coarse timing selector 602b and interpolator 603b. A final clock signal with a predetermined duty cycle or pulse width is obtained by applying a logic operation (e.g., logical AND, NAND or NOR) on the clock signals at terminals 605a and 605b.

The above detailed description is provided to illustrate specific embodiments of the present invention and is not intended to be limiting. Numerous modifications and variations within the scope of the present invention are possible. For example, the implementation of interpolator 303 shown in FIG. 4 is merely exemplary, and may be implemented in many other ways. For instance, low pass filters 404a and 404b may be inherent in variable gain amplifiers 405a and 405b, given a proper loop bandwidth to yield such low pass filtering characteristics. As another example, the functions of digital-to-analog converter 403 and variable gain amplifiers 405a and 405b can be integrated, as is known to those skilled in the art. The present invention is set forth in the following claims.

I claim:

1. A precision timing generator, comprising:
a reference clock signal;
a clock generator generating from the reference clock signal a plurality of clock signals of equal frequency, each clock signal being offset from another one of the clock by a predetermined phase;
a first selector circuit selecting a first group of two clock signals, the selected clock signals being offset from each other by the predetermined phase;
a first interpolator circuit receiving the first group of selected clock signals and associating with each clock signal a predetermined weight, and providing a first resulting clock signal that is offset from each of the selected clock signal by less than the predetermined phase and in proportional to the predetermined weights;
a second selector circuit selecting a second group of two clock signals, the selected clock signals being offset from each other by the predetermined phase;
a second interpolator circuit receiving the second group of selected clock signals and associating with each clock signal a predetermined weight, and providing a second resulting clock signal that is offset from each of the selected clock signal by less than the predetermined phase and in proportional to the predetermined weights; and
a logic gate applying a logic operation on the first resulting clock signal and the second resulting clock signal to provide a precision clock signal.

2. A precision timing generator as in claim 1, wherein the clock generator comprises a delay locked loop.

3. A precision timing generator as in claim 1, wherein the predetermined weights are expressed as binary fractions summing to a binary '1'.

4. A precision timing generator as in claim 1, wherein the first interpolator comprises low pass filters that filter the selected clock signals.

5. A precision timing generator as in claim 4, wherein the first interpolator further comprises variable gain amplifiers that amplify the filtered selected clock signals according to the associated weights.

6. A precision timing generator as in claim 5, wherein the first interpolator further comprises a summer that sums the amplified filtered selected clock signals to provide the resulting clock signal.

7. A precision timing generator as in claim 1, further comprising a ultra-wide bandwidth pulse generator providing pulses in accordance with the first resulting clock signal.

8. A method for precision timing generation, comprising:
providing a reference clock signal; generating from the reference clock signal a plurality of clock signals of equal frequency, each clock signal being offset from another one of the clock by a predetermined phase;
selecting a first group of two clock signals, the selected clock signals being offset from each other by the predetermined phase;
associating with each clock signal a predetermined weight and interpolating the selected clock signals to provide a first resulting clock signal that is offset from each of the selected clock signal by less than the predetermined phase and in proportional to the predetermined weights;
selecting a second group of two clock signals, the selected clock signals being offset from each other by the predetermined phase;
associating with each clock signal of the second group of selected clock signals a predetermined weight, and interpolating the second group of selected clock signals to provide a second resulting clock signal that is offset from each of the selected clock signal by less than the predetermined phase and in proportional to the predetermined weights; and
applying a logic operation on the first resulting clock signal and the second resulting clock signal to provide a precision clock signal.

9. A method for precision timing generation as in claim 8, wherein the clock signals are generated using a delay locked loop.

10. A method for precision timing generation as in claim 8, wherein the predetermined weights are expressed as binary fractions summing to a binary '1'.

11. A method for precision timing generation as in claim 8, wherein the interpolating comprises low pass filtering the selected clock signals.

12. A method for precision timing generation as in claim 11, wherein the interpolating further comprises using variable gain amplifiers to amplify the filtered selected clock signals according to the associated weights.

13. A method for precision timing generation as in claim 12, wherein the interpolating further comprises summing the amplified filtered selected clock signals to provide the resulting clock signal.

14. A method for precision timing generation as in claim 8, further comprising generating ultra-wide bandwidth pulses in accordance with the first resulting clock signal.

* * * * *